United States Patent [19]
Mathew

[11] Patent Number: 5,436,082
[45] Date of Patent: Jul. 25, 1995

[54] PROTECTIVE COATING COMBINATION FOR LEAD FRAMES

[75] Inventor: Ranjan J. Mathew, San Jose, Calif.

[73] Assignee: National Semiconductor Corporation, Santa Clara, Calif.

[21] Appl. No.: 174,890

[22] Filed: Dec. 27, 1993

[51] Int. Cl.⁶ ............ B32B 15/01; B32B 15/20; C25D 7/00
[52] U.S. Cl. .............................. 428/670; 428/673; 428/675; 205/50; 205/181; 205/182; 257/666
[58] Field of Search ............. 205/170, 181, 182, 50; 427/96, 98, 99; 428/673, 670, 675; 257/677, 666

[56] References Cited

U.S. PATENT DOCUMENTS

| 3,648,355 | 3/1972 | Shida et al. | 428/673 |
| 4,141,029 | 2/1979 | Dromsky | 357/70 |
| 4,529,667 | 7/1985 | Shiga et al. | 428/646 |
| 4,894,752 | 1/1990 | Murata et al. | |

FOREIGN PATENT DOCUMENTS

| 0250146 | 12/1987 | European Pat. Off. | |
| 0335608 | 10/1989 | European Pat. Off. | |
| 0384586 | 1/1990 | European Pat. Off. | H01L 23/02 |
| 0538019 | 4/1993 | European Pat. Off. | |
| 228695 | 11/1985 | Japan | 205/182 |
| 1257356 | 10/1989 | Japan | 257/677 |
| 04312937 | 11/1992 | Japan | |
| 05090465 | 4/1993 | Japan | |

OTHER PUBLICATIONS

Donald C. Abbott et al., Palladium as a Lead Finish for Surface Mount Integrated Circuit Packages; Texas Instruments Incorporated, Dallas, Tex., frm IEPC Proceedings, Sep. 1990.

Primary Examiner—John Niebling
Assistant Examiner—Edna Wong
Attorney, Agent, or Firm—Limbach & Limbach; H. Donald Nelson; Stephen R. Robinson

[57] ABSTRACT

A lead frame for a semiconductor device includes a base layer which is coated by a protective coating. The protective coating includes a layer of nickel, over which is coated a layer of copper. The layer of copper is coated by a layer of silver over which is coated a layer of palladium. Protective coatings constructed in this way are bondable, solderable, oxidation resistant, corrosion resistant, free of lead (Pb), resistant to high temperatures, cost effective, and cosmetically acceptable.

11 Claims, 1 Drawing Sheet

PROTECTIVE COATING COMBINATION FOR LEAD FRAMES

BACKGROUND OF THE INVENTION

1. Field of the Invention

The present invention relates to the construction of lead frames for semiconductor devices.

2. Background Art

Copper lead frames are employed extensively in semiconductor device packages primarily due to their high thermal conductivity. Often, the lead frame is preplated with a suitable coating metal prior to encapsulation because the coating significantly reduces the number of assembly steps typically required for post-assembly coating processes. The preplate coating protects the exposed lead frame, and promotes wire bonding and solderability of the leads after encapsulation.

Optimal lead frame coatings should be free of lead (Pb), corrosion resistant, oxidation resistant, resistant to high temperatures (over 200° C.), wire-bondable, and solderable after assembly and burn-in processes. Additionally, the coating should be cost effective and cosmetically acceptable.

The prior art discloses lead frame coatings in which the outermost coating layers comprise nickel and palladium. However, lead frames are required to possess a relatively high solderability coverage as measured by standard solderability tests. In some cases, it has been found that such preplated leads are not as solderable as might be desired.

Thus, there is a need for a lead frame structure which is readily solderable, while still exhibiting the desirable characteristics described above.

SUMMARY OF THE INVENTION

It is an object of the present invention to provide a preplated copper lead frame coating that produces a finish that is readily bondable, solderable, free of lead, corrosion resistant and cosmetically acceptable. It is a further object of the invention to provide a preplated palladium lead frame coating finish that is undercoated with silver and copper in order to improve solderability.

In accordance with the present invention a copper lead frame is first coated with nickel using methods well known in the art. Then a thin layer of copper in the form of a strike coating is applied over the nickel. Next, a layer of silver is applied to the copper coating. A palladium finish coat is then applied over the silver. The silver layer acts to promote solderability of the lead frame. The copper layer promotes adherence between the silver layer and the nickel layer, improves solderability, and enhances tarnish resistance.

A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

Figure 1:
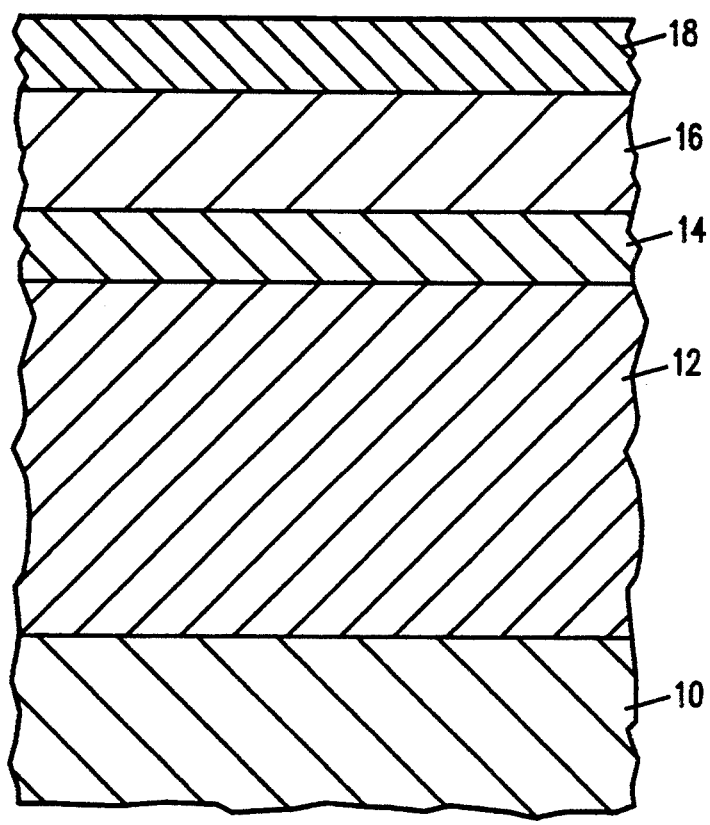
FIG. 1 is a cross-sectional view (not to scale) illustrating a fragment of an embodiment of a lead frame according to the present invention.

Referring to a preferred embodiment of the invention shown in FIG. 1, the base layer 10 of the lead frame is made of any suitable lead frame base material, for example copper or a copper alloy. Two examples of acceptable alloys are sold under the names Olin Alloy C-7025 and Olin Alloy 194, by Olin Brass of East Alton, Ill. One advantage of a copper base metal layer is high thermal conductivity.

The base metal layer 10 is coated with a nickel layer 12. One method of applying the nickel layer 12 is by electrolytic deposition, a technique which is well-known in the art. The thickness of nickel layer 12 should be between 1.25 and 2.50 microns, preferably about 1.5 microns.

A copper layer 14 is applied over the nickel layer 12 by electrolytic deposition. The copper layer 14 is made of either pure copper or a copper alloy, pure copper being preferred. Cu-Sn and Cu-Ag are two examples of copper alloys which exhibit sufficient solderability such that these alloys could be expected to work effectively as copper layer 14 in embodiments of the present invention. The thickness of the copper layer 14 should be between 0.08 and 0.38 microns, preferably about 0.25 microns. One benefit of the copper layer 14 is improved solderability of the finished lead frame. The copper layer 14 also seems to enhance tarnish resistance of the lead frame coating.

A silver layer 16 is then applied over the copper layer 14 by electrolytic deposition. The copper layer 14 promotes adherence between the silver layer 16 and the nickel layer 12. The silver layer 16 is made of either pure silver or a silver alloy, pure silver being preferred. Ag-Pd and Ag-Sn are two examples of materials which exhibit sufficient solderability such that these alloys could be expected to work effectively as the silver layer 16 in embodiments of the present invention. The thickness of the silver layer 16 should be between 0.13 and 1.0 microns, preferably about 0.63 microns. One benefit of the silver layer 16 is improved solderability of the finished lead frame. The silver layer 16 is also cost effective and wire-bondable.

A palladium layer 18 is applied over the silver layer 16, by electrolytic deposition, to provide the coating surface finish. The palladium layer 18 is made of either pure palladium or a palladium alloy, such as Pd-Ni or Pd-Co. The thickness of the palladium layer 18 should be between 0.08 and 0.63 microns, preferably about 0.25 microns. The palladium layer 18 serves to protect the silver layer 16 from tarnish. Furthermore, the palladium layer 18 of the present invention imparts oxidation resistance, corrosion resistance and a cosmetically acceptable finish to the lead frame.

It has been found that the copper and silver layers 14 and 16 greatly enhance the solderability performance of the palladium layer 18. The silver layer 16 dissolves more rapidly in solder than palladium materials. The copper layer 14 improves the solderability by alloying with the solder during the soldering process. For instance, the copper layer 14 will alloy with Sn during soldering with Sn-Pb solder. The copper layer 14 is also thought to enhance wettability during the soldering process. In this way, the combination of coating materials disclosed in the present invention exhibits improved solderability over palladium and nickel coated lead frames.

Because lead frame coating materials, such as palladium, can be expensive, another benefit of the present invention is that the copper layer 14, the silver layer 16, and/or the palladium layer 18 can be selectively applied only in areas of the lead frame that are to be soldered after encapsulation. This selective application minimizes the amount of copper, silver and/or palladium which must be used.

It is to be understood that the present invention is not limited to the above described embodiments, and that various changes and modifications could be effected by one skilled in the art without departing from the spirit or scope of the invention as defined in the appended claims.

What is claimed is:

1. A protective coating for a lead frame, the protective coating comprising:
   a lead frame;
   a nickel layer disposed over said lead frame;
   a copper-containing layer disposed over said nickel layer;
   a silver-containing layer disposed over said copper-containing layer; and
   a palladium-containing layer disposed over said silver-containing layer.

2. The protective coating of claim 1 wherein said copper-containing layer consists essentially of copper.

3. The protective coating of claim 1 wherein said copper-containing layer comprises a copper alloy.

4. The protective coating of claim 1 wherein said silver-containing layer consists essentially of silver.

5. The protective coating of claim 1 wherein said silver-containing layer comprises silver alloy.

6. The protective coating of claim 1 wherein said palladium-containing layer consists essentially of palladium.

7. The protective coating of claim 1 wherein said palladium-containing layer comprises a palladium alloy.

8. The protective coating of claim 1 wherein the nickel layer is between 1.25 and 2.50 microns in thickness, the copper-containing layer is between 0.08 and 0.38 microns in thickness, the silver-containing layer is between 0.13 and 1.0 microns in thickness, and the palladium-containing layer is between 0.08 and 0.63 microns in thickness.

9. The protective coating of claim 1 wherein the nickel layer is about 1.5 microns thick, the copper-containing layer is about 0.25 microns thick, the silver-containing layer is about 0.63 microns thick, and the palladium-containing layer is about 0.25 microns thick.

10. A method of fabricating a protective coating for a lead frame comprising the steps of:
    supplying a copper lead frame base;
    electroplating a nickel layer over the copper lead frame base;
    electroplating a copper-containing layer over the nickel layer;
    electroplating a silver-containing layer over the copper-containing layer; and
    electroplating a palladium-containing layer over the silver-containing layer.

11. The method of claim 10 wherein:
    the copper-containing layer consists essentially of copper;
    the silver-containing layer consists essentially of silver; and
    the palladium-containing layer consists essentially of palladium.

* * * * *